(12) United States Patent
Ni

(10) Patent No.: US 6,747,468 B2
(45) Date of Patent: Jun. 8, 2004

(54) CIRCUIT TRIMMING OF PACKAGED IC CHIP

(75) Inventor: James Seng-Ju Ni, Hsinchu (TW)

(73) Assignee: Anachip Corp. (TW)

( * ) Notice: Subject to any disclaimer, the term of this patent is extended or adjusted under 35 U.S.C. 154(b) by 174 days.

(21) Appl. No.: 09/990,856

(22) Filed: Nov. 21, 2001

(65) Prior Publication Data

US 2003/0042919 A1 Mar. 6, 2003

(30) Foreign Application Priority Data

Aug. 28, 2001 (TW) ........................................ 90121109 A

(51) Int. Cl.⁷ .............................................. G01R 31/26
(52) U.S. Cl. ..................... 324/765; 324/158.1; 714/724; 368/120
(58) Field of Search ......................... 324/750, 751–753, 324/158.1, 765, 754, 758; 365/185.23, 189.06, 189.11; 327/525, 334, 530, 526; 702/18, 21, 14

(56) References Cited

U.S. PATENT DOCUMENTS 4,438,347 A * 3/1984 Gehring ..................... 327/511
6,396,759 B1 * 5/2002 Lesher ..................... 365/225.7
6,430,087 B1 * 8/2002 Bill et al. .............. 365/185.23
6,462,609 B2 * 10/2002 Hashimoto et al. ......... 327/525

* cited by examiner

Primary Examiner—David A. Zarneke
Assistant Examiner—Jimmy Nguyen
(74) Attorney, Agent, or Firm—Lowe Hauptman Gilman & Berner, LLP

(57) ABSTRACT

To accomplish circuit trimming of a packaged IC chip by applying a magnetic field thereon, a magnetically configurable adjuster device is coupled with the packaged IC chip. The magnetically configurable adjuster device includes a Hall element, a signal processor and amplifier device, a decoder, and a configurable adjuster that receives a signal outputted by the packaged IC chip. The configurable adjuster includes a plurality of electrically configurable elements and circuit-trimming members. The Hall element senses and converts the magnetic field into a voltage signal by Hall effect. After amplification, the voltage signal is inputted to the decoder. The decoder decodes the voltage signal into decoded signals that configure the configurable adjuster by means of the configurable elements. With the configurable adjuster hence configured, circuit trimming of the packaged IC chip is achieved via the circuit-trimming members.

18 Claims, 3 Drawing Sheets

CIRCUIT TRIMMING OF PACKAGED IC CHIP

CROSS-REFERENCE TO RELATED APPLICATION

This application claims the priority benefit of Taiwan application serial no. 90121109, filed Aug. 28, 2001.

BACKGROUND OF THE INVENTION

1. Field of the Invention

The invention relates generally to circuit trimming and, more particularly, the invention relates to circuit trimming of a packaged IC chip.

2. Description of the Related Art

In integrated circuit (IC) manufactures, the final IC chip product generally does not run with exactly-expected results. These deviations are typically due to the accumulation of deviations of the numerous semiconductor processes that are performed to achieve the final IC chip product. In some cases, for example in digital circuits, the consequences of these deviations may be minor. In other cases when the input/output (I/O) signals of the IC chip product must be strictly controlled, for example in analog circuits, the consequences of these deviations may be problematic.

To compensate the deviations generated by the IC manufacture processes, circuit trimming is conventionally achieved via electrically coupling an adjuster device with the circuit of the IC chip.

Referring to FIG. 1, a block diagram schematically illustrates a conventional adjuster device for circuit trimming. As shown in FIG. 1, the output signal of an IC chip 100 conventionally pass through an adjuster device 102 before being externally delivered. The role of the adjuster device 102 is to ensure that the signal outputted by the IC chip 100 is strictly within a permitted range. To attain this purpose, the adjuster device 102 conventionally includes fuses (108, 110, 112) and resistors. Some of the fuses (108, 110, 112) may be electrically cut off to configure the adjuster device 102 in such a way that signals outputted are restricted within a desired range, thereby achieving circuit trimming of the IC chip 100.

With the adjuster device 102 coupled with the IC chip 100, configuring the adjuster device 102 may be typically accomplished either before or after the IC chip 100 is packaged. Before the IC chip 100 is packaged, the adjuster device 102 can be easily configured via, for example, a laser method that electrically cuts off the desired fuses. A disadvantage of this method is that it cannot compensate deviations due to IC chip packaging.

If circuit trimming is accomplished after the IC chip 100 is packaged, metal pads (103, 104, 106) and theretoconnected contact pins (not shown) must be conventionally arranged in such a manner that the contact pins externally expose through the packaging structure. Furthermore, an additional amount of circuitry is also necessary to enable the configuration of the adjuster circuit via the contact pins through the packaging structure. As a result, the space occupation of the adjuster circuit may be negatively increased, which results in an increase of the surface area of the IC chip. Because the number of contact pins is increased, accessibility problems may further arise

SUMMARY OF THE INVENTION

An aspect of the present invention is to provide a magnetically configurable adjuster device that, coupled with a packaged IC chip, can achieve circuit trimming without specific arrangements of additional contact pins and metal pads.

To accomplish the above and other objectives, the magnetically configurable adjuster device of the invention comprises a Hall element, a signal processor and amplifier device, a decoder, and a configurable adjuster. The signal processor and amplifier device connects to the output of the Hall element, the decoder connects to the output of the signal processor and amplifier device, and the configurable adjuster connects to the output of the decoder. The configurable adjuster includes a plurality of configurable elements and a plurality of circuit-trimming members, and further receives signals outputted by the packaged IC chip.

To achieve circuit trimming, a magnetic field is applied on the packaged IC chip. The magnetic field generated is directed to set a desired configuration of the configurable adjuster for achieving circuit trimming of the packaged IC chip. The Hall element senses and converts the magnetic field into a corresponding voltage signal by Hall effect. The voltage signal, after amplification through the signal processor and amplifier device, is delivered to the decoder. The decoder decodes the voltage signal into a plurality of decoded signals that are inputted to the configurable adjuster to configure the configurable elements. The configurable adjuster is thereby configured to obtain a desired circuit trimming of the packaged IC chip via the circuit-trimming members therein.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
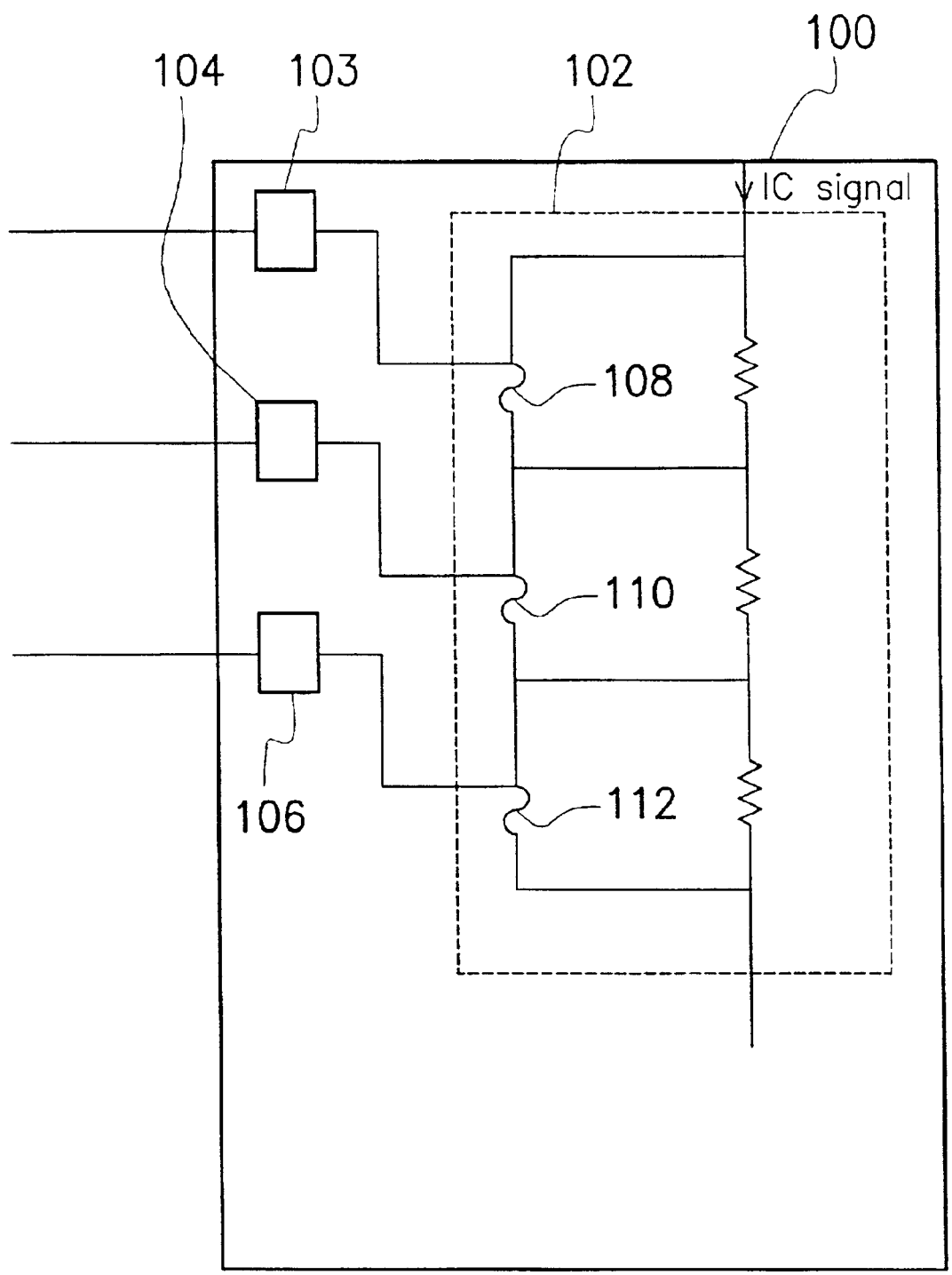
FIG. 1 is a block diagram that schematically illustrates a conventional adjuster device for circuit trimming.

The following detailed description of the embodiments and examples of the present invention with reference to the accompanying drawings is only illustrative and not limiting. Wherever possible in the following description and accompanying drawings, like reference numerals and symbols will refer to like elements and parts unless otherwise described.

The invention provides a configurable adjuster device that can achieve circuit trimming of a packaged IC chip by means of Hall effect. Circuit trimming can be thereby accomplished after the IC chip is packaged without the disadvantages of the prior art.

Hall-effect sensors are well known in the art to operate on the principle that a magnetic field which is applied perpendicular to the direction of a current flowing through a semiconductor generates an electric field therein. This resultant electric field generates a voltage that may be measured through the semiconductor to obtain an indication of the magnitude of the magnetic field applied to the semiconductor. "Hall element" in the description of the invention refers to a device that operates on the principle of Hall-effect sensors such as described above.

Furthermore, "circuit trimming" in the description means adjusting the circuit of an IC chip to obtain a desired level or range of level of a signal outputted by the IC chip. "Electrically configurable elements" and "configurable elements" are interchangeably used in the description to refer to the same elements.

Figure 3:
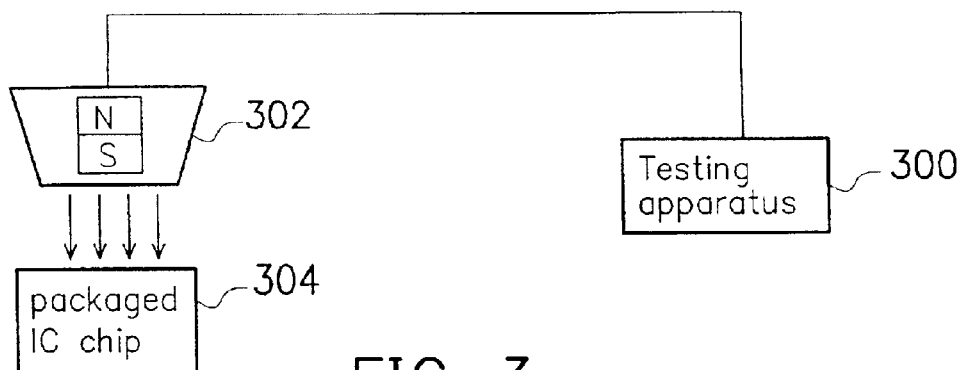
FIG. 3 is a block diagram that schematically illustrates an installation for circuit trimming according to an embodiment of the invention.
Figure 4:
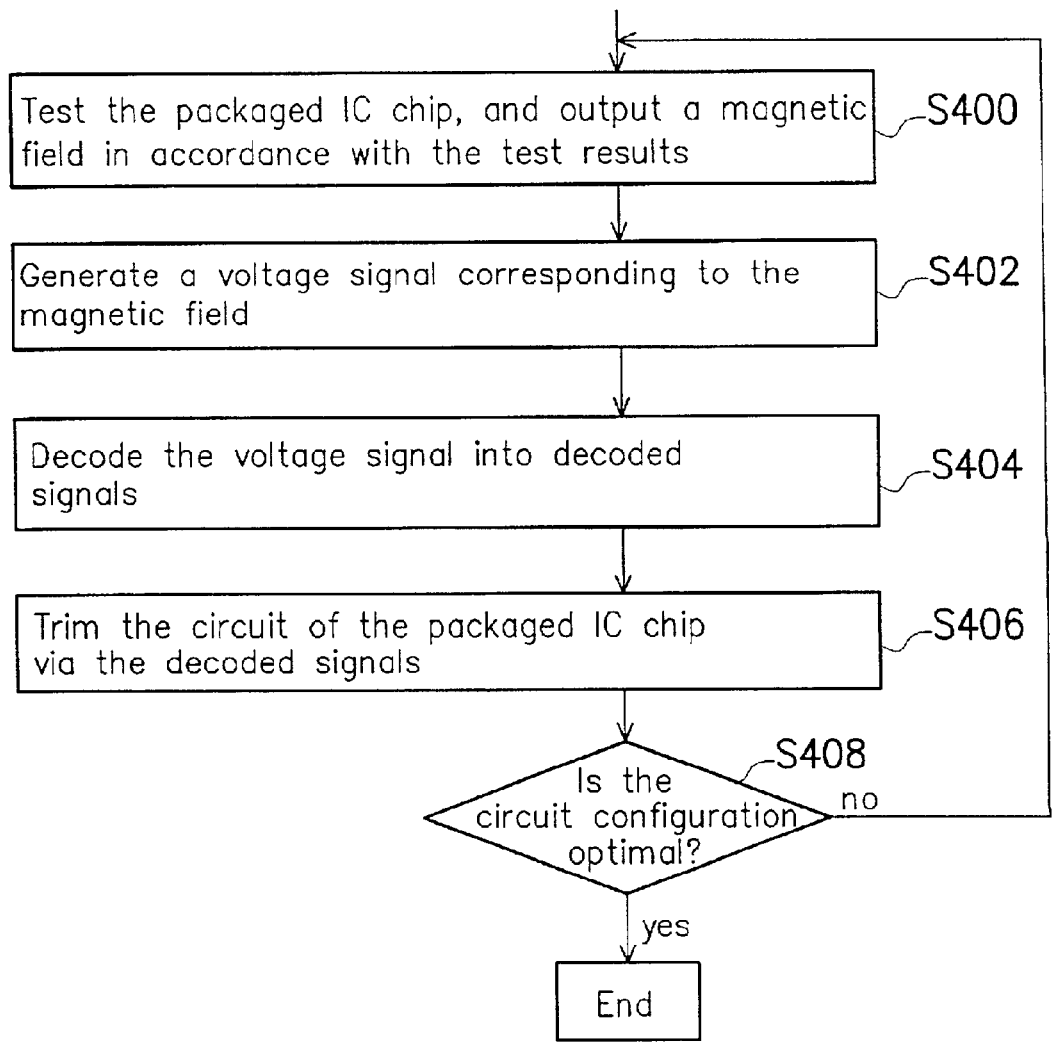
FIG. 4 is a flow diagram that schematically illustrates a process of circuit trimming performed according to the invention.

Referring now to FIG. 3 and FIG. 4, a block diagram and a flow diagram schematically illustrate various stages in a process of circuit trimming that are accomplished according to an embodiment of the invention. As illustrated in FIG. 3, the invention uses a testing apparatus 300 and a magnetic field generator 302 to perform circuit trimming of a packaged IC chip 304. The packaged IC chip 304 is provided with a configurable adjuster device of the invention that can be magnetically configured to achieve a desired circuit trimming. A detailed description of the magnetically configurable adjuster device for circuit trimming of the invention will be provided further.

At step S400, the packaged IC chip 304 is electrically tested via the testing apparatus 300. Depending on the test results of the packaged IC chip 304, the testing apparatus 300 transmits a trim signal to the magnetic field generator 302. In accordance with the trim signal from the testing apparatus 300, the magnetic field generator 302 generates a magnetic field that is applied on the packaged IC chip 304. The magnetic field generated is directed to set a specific configuration of the magnetically configurable adjuster device that would result in desired circuit trimming of the packaged IC chip 304.

At step S402, the magnetic field causes a voltage signal to be generated by Hall effect within the magnetically configurable adjuster device of the packaged IC chip 304.

At step S404, the voltage signal is decoded and transformed into corresponding decoded signals.

At step S406, the decoded signals then effectively configure the configurable adjuster device to achieve circuit trimming of the packaged IC chip 304.

A test may be subsequently performed at step S408 to determine whether the desired circuit trimming is effectively obtained. If further adjustments are necessary, the above sequence S400 through S406 may be repeated until the desired configuration is effectively obtained.

Figure 2A:
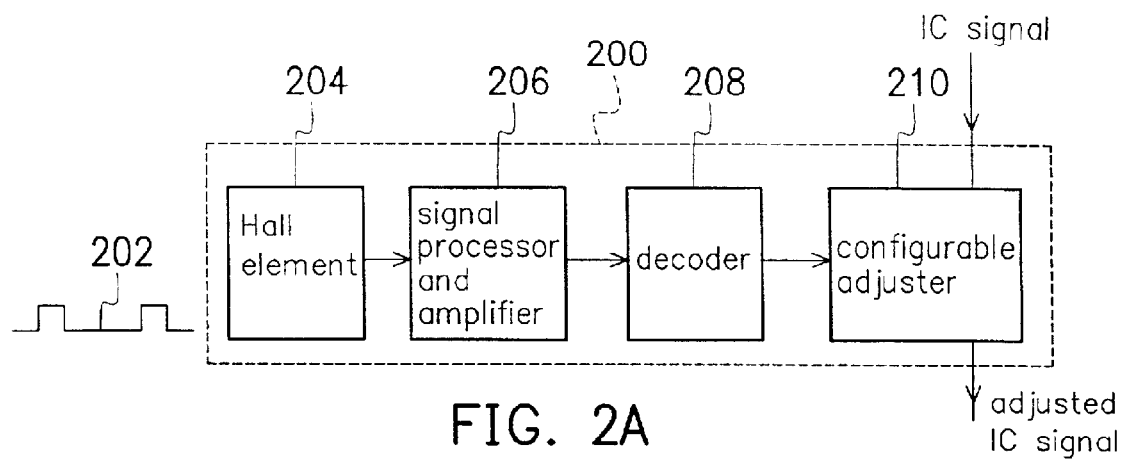
FIG. 2A through FIG. 2.C are block diagrams that schematically illustrate a configurable adjuster device for circuit trimming according to an embodiment of the invention.

Referring now to FIG. 2A, a block diagram schematically illustrates a magnetically configurable adjuster device for circuit trimming according to an embodiment of the invention. In the invention, a magnetically configurable adjuster device 200 that is electrically coupled with a packaged IC chip is used to trim the circuit of the packaged IC chip. The magnetically configurable adjuster device 200 comprises a Hall element 204, a signal processor and amplifier device 206, a decoder 208, and a configurable adjuster 210. The signal processor and amplifier device 206 connects to the output of the Hall element 204, the decoder 208 connects to the output of the signal processor and amplifier device 206, and the configurable adjuster 210 connects to the output of the decoder 208. The configurable adjuster 210 further receives signals outputted from the IC chip.

According to the magnetic field 202 that is generated via the magnetic field generator 302 (see FIG. 3) and sensed by the Hall element 204, the Hall element 204 outputs a corresponding voltage signal that is amplified via the signal processor and amplifier device 206. The amplified voltage signal then is delivered to the decoder 208.

Figure 2B:
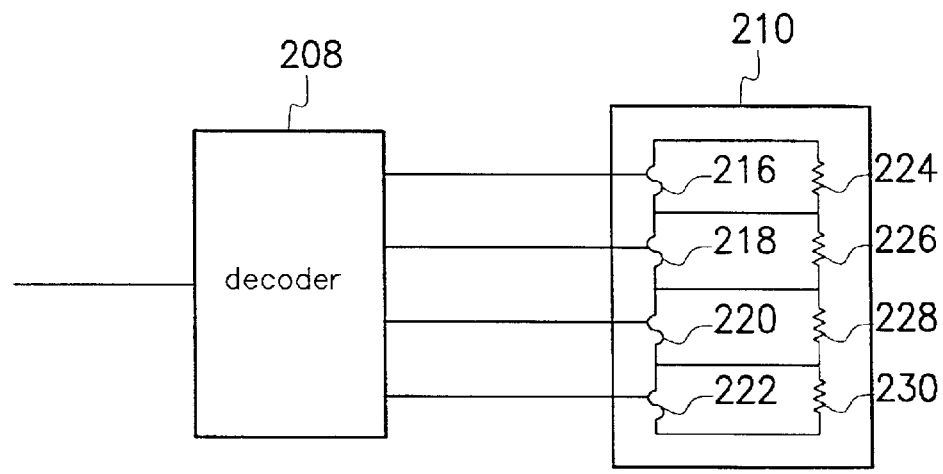
Figure 2C:
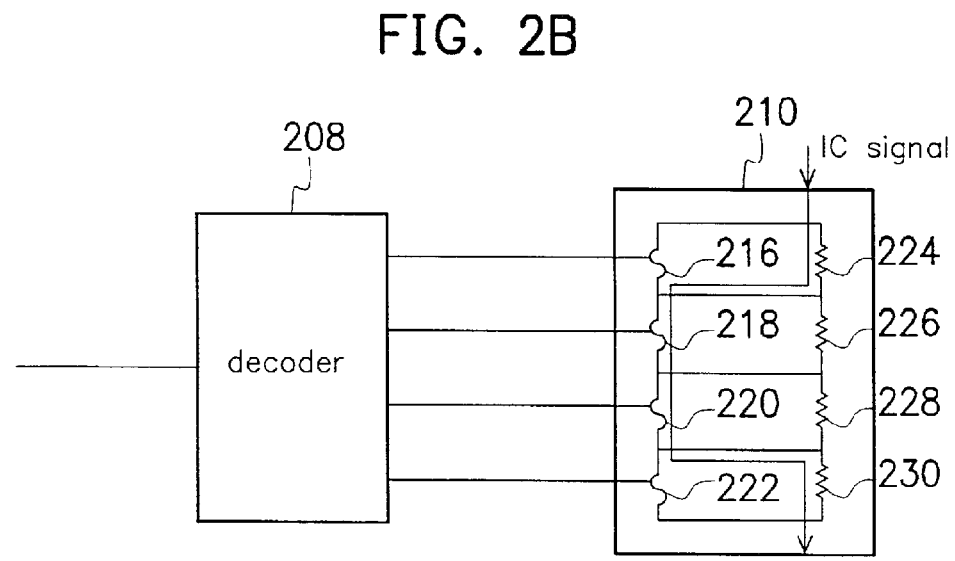

Referring to FIG. 2B and FIG. 2C, two block diagrams schematically show the decoder 208 and the configurable adjuster 210 according to an embodiment of the invention. As illustrated in FIG. 2B and FIG. 2C, the configurable adjuster 210, electrically coupled with the packaged IC chip, includes a plurality of electrically configurable elements (216, 218, 220, 222) and a plurality of circuit-trimming members (224, 226, 228, 230) that are electrically coupled with one another. As illustrated, the circuit-trimming members (224, 226, 228, 230) may include resistors, for example. The electrically configurable elements (216, 218, 220, 222) enable to configure a desired circuit trimming of the packaged IC chip via the circuit-trimming members. The configurable elements (216, 218, 220, 222) may be composed of fuses, for example. It should be apparent to those skilled in the art that circuit-trimming members other than the above-recited resistors may be adequate to achieve circuit trimming.

When receiving the amplified voltage signal from the signal processor and amplifier device 206, the decoder 208 outputs a corresponding decoder signal to configure the configurable elements (216, 218, 220, 222) of the configurable adjuster 210. In this embodiment of the invention, the decoder 208 typically receives the voltage signal in series and outputs the corresponding decoder signal that is composed of a plurality of decoded signals in parallel to configure each of the configurable elements (216, 218, 220, 222).

With the example of configurable elements (216, 218, 220, 222) as fuses, a decoder signal that has, for example, an equivalent binary code "1001" may, for example, electrically cut off the fuses 216 and 222. The resulting circuit trimming thus causes a current from the packaged IC chip to only flow through the resistors 224 and 230.

Those skilled in the art would readily understand that the above configuration of the configurable adjuster 210 in current mode could be implemented via other types of electrically configurable elements such as metal fuses or poly-fuses, for example. Besides current mode, it would be apparent to those skilled in the art that the configurable adjuster 210 can be also favorably configured in voltage mode. In this case, the configurable elements (216, 218, 220, 222) may include, for example, zapped diodes, EPROM devices, EEPROM devices, amorphous silicon (a-Si) based antifuses, or oxide/nitride/oxide (ONO) based antifuses.

In conclusion, the invention provides a magnetically configurable adjuster device for circuit trimming that can favorably trim the circuit of a packaged IC chip without arrangement of specific pads/contact pins and additional amounts of circuitry. As a result, deviations due to packaging processes can be favorably compensated while the number of pins that are formed is favorably not increased. To achieve circuit trimming, an installation magnetically configures a magnetically configurable adjuster device that is coupled with the circuit of the packaged IC chip and includes circuit-trimming members. The magnetically configurable adjuster device can be magnetically configured by means of a Hall element, a signal processor and amplifier device, a decoder, and a configurable adjuster that are arranged therein. More particularly, the configurable adjuster includes the circuit-trimming members and a plurality of configurable elements that enable to configure a desired circuit trimming of the packaged IC chip via the circuit-trimming members. By using Hall effect to configure the magnetically configurable adjuster device, circuit trimming can be therefore achieved without conventional accessibility and space occupation problems.

It should be apparent to those skilled in the art that other structures that are obtained from various modifications and variations of the structures of the present invention would be possible without departing from the scope and spirit of the invention as illustrated herein. Therefore, the above description of embodiments and examples only illustrates specific ways of making and performing the invention that, consequently, should cover variations and modifications thereof provided they fall within the scope of the invention as defined in the following claims.

What is claimed is:

1. A magnetically configurable adjuster device for trimming a circuit of a packaged integrated circuit (IC) chip to which the magnetically configurable adjuster device is coupled, the magnetically configurable adjuster device comprising:

a Hall element, wherein the Hall element can sense a magnetic field that is applied onto the packaged IC chip to trim the circuit of the packaged IC chip, and generate a corresponding voltage signal;

a signal processor and amplifier device that is connected to the Hall element, wherein the signal processor and amplifier device receives and amplifies the voltage signal from the Hall element;

a decoder that is connected to the signal processor and amplifier device, wherein the decoder receives the voltage signal amplified by the signal processor and amplifier device and outputs a plurality of corresponding decoded signals; and a configurable adjuster that is connected to the decoder, wherein the configurable adjuster includes a plurality of circuit-trimming members and a plurality of electrically configurable elements which configurations can be modified by the decoded signals so as to accomplish a desired circuit trimming of the packaged IC chip via the circuit-trimming members.

2. The magnetically configurable adjuster device of claim 1, wherein the electrically configurable elements include a metal fuse.

3. The magnetically configurable adjuster device of claim 1, wherein the electrically configurable elements include a poly-fuse.

4. The magnetically configurable adjuster device of claim 1, wherein the electrically configurable elements include a zapped diode.

5. The magnetically configurable adjuster device of claim 1, wherein the electrically configurable elements include an Electrically Programmable Read Only Memory (EPROM) device.

6. The magnetically configurable adjuster device of claim 1, wherein the electrically configurable elements include an Electrically Erasable and Programmable Read Only Memory (EEPROM) device.

7. The magnetically configurable adjuster device of claim 1, wherein the electrically configurable elements include an amorphous silicon-based fuse.

8. The magnetically configurable adjuster device of claim 1, wherein the electrically configurable elements include an oxide/nitride/oxide (ONO) based antifuse.

9. The magnetically configurable adjuster device of claim 1, wherein the circuit-trimming members include a resistor.

10. An installation for trimming a circuit of a packaged integrated circuit (IC) chip, the installation comprising:

a testing apparatus, wherein the testing apparatus tests the circuit of the packaged IC chip to obtain a responsive output signal thereof and delivers a trim signal according to the responsive output signal to command a circuit trimming;

a magnetic field generator that is coupled with the testing apparatus, wherein the magnetic field generator receives the trim signal and generates a magnetic field in accordance with the trim signal, wherein the magnetic field is applied on the packaged IC chip; and a magnetically configurable adjuster device electrically coupled with the circuit of the packaged IC chip, wherein the magnetically configurable adjuster device further includes a Hall element, a decoder, a plurality of electrically configurable elements, and a plurality of circuit-trimming members that are coupled with one another in such a manner that the magnetic field generates a resulting electrical signal that configure the electrically configurable elements to obtain a desired circuit trimming of the packaged IC chip via the circuit-trimming members.

11. The installation of claim 10, wherein the electrically configurable elements include a metal fuse.

12. The installation of claim 10, wherein the electrically configurable elements include a poly-fuse.

13. The installation of claim 10, wherein the electrically configurable elements include a zapped diode.

14. The installation of claim 10, wherein the electrically configurable elements include an Electrically Programmable Read Only Memory (EPROM) device.

15. The installation of claim 10, wherein the electrically configurable elements include an Electrically Erasable and Programmable Read Only Memory (EEPROM) device.

16. The installation of claim 10, wherein the electrically configurable elements include an amorphous silicon-based fuse.

17. The installation of claim 10, wherein the electrically configurable elements include an oxide/nitride/oxide (ONO) based antifuse.

18. The installation of claim 10, wherein the circuit-trimming members include a resistor.

* * * * *